United States Patent [19]

Wendt

[11] Patent Number: 5,066,924
[45] Date of Patent: Nov. 19, 1991

[54] PULSE POWER AMPLIFIER

[75] Inventor: Peter Wendt, Augsburg, Fed. Rep. of Germany

[73] Assignees: Siemens Aktiengesellschaft, Berlin and Munich, Fed. Rep. of Germany; Siemens Aktiengesellschaft, Berlin and Munich, Fed. Rep. of Germany

[21] Appl. No.: 659,889

[22] Filed: Feb. 25, 1991

[51] Int. Cl.$^5$ .............................................. H03F 3/68
[52] U.S. Cl. .................................. 330/124 R; 330/84; 330/295; 330/144; 330/145; 330/284
[58] Field of Search .................... 330/124 R, 295, 84, 330/284, 144, 145

[56] References Cited

U.S. PATENT DOCUMENTS

| | | | |
|---|---|---|---|
| 3,094,587 | 6/1963 | Dow | 330/124 R |
| 3,516,024 | 6/1970 | Lange | 330/124 R |
| 4,490,684 | 12/1984 | Epsom et al. | 330/124 R |
| 4,631,493 | 12/1986 | Vendelin et al. | 330/295 |
| 4,656,434 | 4/1987 | Selin | 330/124 R |
| 4,825,177 | 4/1989 | Teague et al. | 330/295 |

OTHER PUBLICATIONS

"Power Amplifiers for Airborne DME Applications," Microwave Semiconductor Corp., Application Note AV—201, Date Code 0778—3M.

Primary Examiner—Eugene R. LaRoche
Assistant Examiner—Tan Dinh
Attorney, Agent, or Firm—Hill, Van Santen, Steadman & Simpson; Hill, Van Santen, Steadman & Simpson

[57] ABSTRACT

A pulse amplifier has a driver stage and a following splitter/combiner stage for power division onto two output stages connected in parallel as well as a further splitter/combiner stage that combines the output signals of the output stages. The two splitter/combiner stages each comprise a respective further decoupled port each of which is respectively connected to a switch-over device. The further ports are connected to terminating impedances in a first switch position of the switch-over devices and are connected to one another via an additional signal path in a second switch position and the output stages can be respectively terminated with low impedances at their input sides and output sides via switch elements.

3 Claims, 1 Drawing Sheet

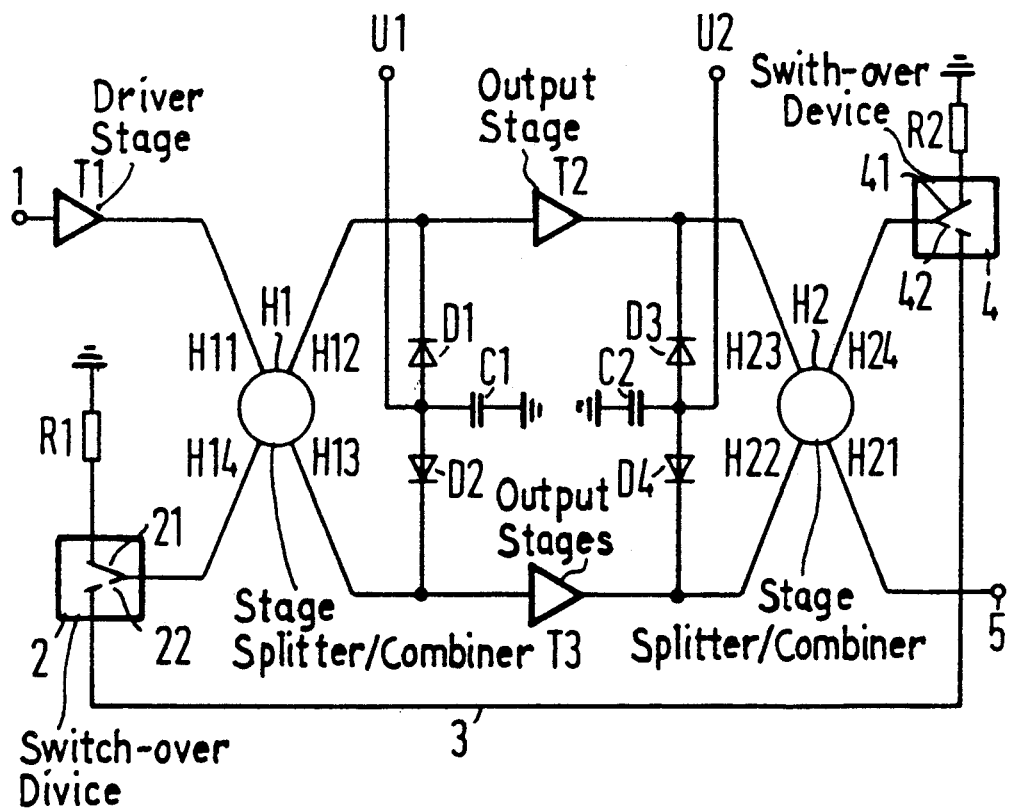

PULSE POWER AMPLIFIER

CROSS REFERENCE TO RELATED APPLICATION

This application is related to a co-pending application, Ser. No. 07/656,234, filed Feb. 15th, 1991.

BACKGROUND OF THE INVENTION

1. Field of the Invention

The present invention relates to a pulse power amplifier of the type which comprises a driver stage for receiving an input pulse to be amplified and a splitter/combiner stage following the driver stage for power division onto two output stages connected in parallel thereto.

2. Description of the Prior Art

A pulse power amplifier of the type generally set forth above is known from Application Note AV-201, June 1978, of the Microwave Semiconductor Corporation.

High-frequency power transistors are employed for pulse operation in pulse power amplifiers that generate peak pulse powers of 200W and above into the GHz range. The obtainable pulse power of individual transistors is limited and lies on the order of magnitude of 100W, dependent on the pulse format. For thermal reasons, the transistors thereby operate in the non-linear class C mode and are only driven into the class A mode or class B mode during the gating operation.

Higher output powers are achieved by parallel circuits having a plurality of transistors. The amplifier circuits thereby contain splitter/combiner stages as decoupling elements and, in order to divide or, respectively, to combine the signals to be amplified or, respectively, the amplified signals. As dividers, 3 dB power dividers, or what are referred to as 3 dB hybrids are employed as splitter/combiner stages. Such "hybrid couplers" are known, for example, from the catalog of the ANAREN Company. When the output signals of the hybrids have a relative phase ±90° or of 0° and 180° relative to one another, then they are called a 9020 hybrid or a 180° hybrid. Dividers such as 3 dB power dividers referred to as three-ports or four-ports that symmetrically divide power supplied at one port onto two other ports are known in the art. In four-port power dividers, one port is also decoupled. In this connection reference may be taken to R. K. Hoffmann, Integrierte Mikrowellenschaltungen, Springer Verlag, pp. 14–15. In the known amplifier circuits, this port is terminated with an absorber resistor.

In certain applications of the pulse power amplifiers, it is not only a fixed, high-output power that is required; rather, a maximum and a minimum value of the output pulse power is required in view of low detectability and different distances to be bridged. The output pulse power can thereby differ by 10–30 dB.

It is conceivable to reduce the power output by the pulse power amplifier in that the drive power of one of the two output stage transistors connected parallel to one another is disconnected on the basis of a switch-over device. What is referred to as a SPDT (single-pole, double-throw) switch can thereby be employed as a switch-over device (in this connection see Application of PIN Diodes, Application Note 922 of Hewlett Packard). The switch losses must thereby be compensated by an increased driver power. Given reduced output power, the activated output stage transistor continues to work at full gain and power, this having a disadvantageous affect on the efficiency and on the reliability of the overall circuit.

SUMMARY OF THE INVENTION

The object of the present invention is to provide a pulse power amplifier that can be set to greatly different output power levels.

The above object is achieved, according to the present invention, in a pulse power amplifier which comprises a driver stage for receiving an input pulse to be amplified and a splitter/combiner stage following the driver stage for power division onto two output stages connected extending in parallel therefrom, and further comprises a further splitter/combiner stage that combines the output signals of the output stages and at which the output pulse can be taken and is particularly characterized in that the two splitter/combiner stages each respectively comprise a further, decoupled port each of which is respectively connected to a switch-over device. The further ports are connected to terminating impedances in a first switch position of the switch-over device and are connected to one another via an additional signal path in a second switch position. The output stages can be respectively terminated in a low-impedance manner at their input side and output side via switch elements.

In a pulse power amplifier constructed in accordance with the present invention, changes in the pulse spectrum due to control distortions of the output stage are avoided. A defined pulse shape on the basis of a corresponding pulse shaping in the amplification can continue to be observed.

A further advantage is that no attenuation losses due to switch arrangements need to be compensated given output of the maximum peak pulse power.

BRIEF DESCRIPTION OF THE DRAWINGS

Other objects, features and advantages of the invention, its organization, construction and operation will be best understood from the following detailed description, taken in conjunction with the accompanying drawing, on which there is a single FIGURE which is a schematic representation of a pulse power amplifier constructed in accordance with the present invention.

DESCRIPTION OF THE PREFERRED EMBODIMENTS

On the drawing, an input pulse to be amplified is applied to an input 1 of a driver stage T1. The driver stage T1 can be constructed for the control or regulation of the output power given simultaneous pulse shaping. Such methods for the modulation of high-frequency power transistors are well-known in the art.

The driver stage T1 has its output connected to an input port H11 of a splitter/combiner stage H1. The splitter/combiner stage H1 is what is referred to as a 3 dB/90° hybrid of the type mentioned above wherein one port is always decoupled. The power reflected at the output ports due to mismatched terminations appear at the decoupled port H14. The decoupled port H14 is connected to a switch-over device 2.

The two ports H12 and H13 of the splitter/combiner stage H1 serve the purpose of symmetrical division of the signal onto two output stages T2 and T3. For example, high-frequency power transistors that operate in the non-linear class C mode for pulse power amplification are employed as the output stages T2 and T3. The output signals of the output stages T2 and T3 are, in turn, combined via two ports H22 and H23 of a further splitter/combiner stage H2 and are output as an output pulse at an output 5 via a port H21. The splitter/combiner stage H2 is also what is referred to as a 3 dB/90° hybrid whose decoupled port H24 is connected to a switch-over device 4. The switch-over devices 2 and 4, for example, are realized by the SPDT switches of the type set forth above.

The output stages T2 and T3 and, therefore, the splitter/combiner stages H1 and H2 can have their inputs and outputs terminated with low impedances via a plurality of diodes D1–D4, for example PIN diodes. To this end, a control voltage U1 is applied via a capacitor C1 and is applied to the two diodes D1 and D2 polarized in the conducting direction, at the input of the output stages T2 and T3. It is fundamentally conceivable that the output stages T2 and T3 be separated from the splitter/combiner stages H1 and H2 via a diode arrangement at the input side or, respectively, the output side and, consequently, that the splitter/combiner stages H1 and H2 be terminated with a high impedance at the input side and the output side.

In a first position 21 and 41 of the two switch-over devices 2 and 4, the two decoupled ports H14 and H24 of the splitter/combiner stages H1 and H2 are each respectively connected to a terminating impedance R1 and R2. In a second switch position 22 and 42 of the two switch-over devices 2 and 4, the two ports H14 and H24 of the splitter/combiner stages H1 and H2 are connected to one another via an additional signal path 3.

Given operation with maximum signal gain, the two switch-over devices 2 and 4 are each respectively in their first switch positions 21 and 24 and the output stages T2 and T3 are activated in terms of DC and high-frequency. The diodes D1–D4 are inhibited by the control voltages U1 and U2 and have a high high-frequency resistance in comparison to 50 ohms. The insertion loss of each diode is in the region of 0.1 dB given a corresponding technology and package format. The maximum power is output at an output 5.

Given operation with minimum signal gain, the two switch-over devices 2 and 4 are each respectively in their second switch positions 22 and 42 and the output stages T2 and T3 can be disconnected in terms of DC, this having a beneficial influence on the reliability. The diodes D1–D4 are driven via the control voltages U1 and U2 into a region having a high-frequency resistance that is a low impedance in comparison to 50 ohms. The power output from the driver stage T1 to the splitter/combiner stage H1 is reflected at the diodes D1 and D2 as a result of the mismatch, is fed into the further splitter/combiner stage H2 via the switch-over devices 2 and 4 and via the additional signal path 3, is reflected at the diodes D3 and D4 and, finally, is output at the output 5.

The required isolation of the switch-over devices 3 and 4 is not higher than 20 dB given operation with maximum signal gain, because of the comparatively low gain of the output stages T2 and T3. The power loss, given operation with reduced output power, amounts to approximately 2–3 dB. The pulse shape is determined only by the modulated driver stage T1 and is not influenced by the control distortions of the output stages T2 and T3.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A pulse power amplifier comprising:
   a driver stage including an input for receiving a pulse to be amplified, and an output; first and second output stages each including an input and an output;
   a first splitter/combiner stage including an input, a first output connected to said input of said first output stage, a second output connected to said input of said second output stage, and a third output;
   a first switch-over device operable to first and second switch conditions and including a first terminal connected to said third output of said first splitter/combiner stage, a second terminal, a first terminating impedance connected to said second terminal, and a third terminal;
   a second splitter/combiner stage including a first input connected to said output of said first output stage, a second input connected to said output of said second output stage, a first output serving as an output for said pulse power amplifier, and a second output;
   a second switch-over device operable to first and second switch conditions and including a first terminal connected to said second output of said second splitter/combiner stage, a second terminal, a second terminating impedance connected to said second terminal, and a third terminal connected to said third terminal of said first switch-over device; and
   control means including first and second control inputs for receiving control signals and control switches connected to said control inputs and to said inputs and outputs of said output stages,
   said pulse power amplifier operable with maximum signal gain and in response to first control signals on said control inputs such that said first and second switch-over devices are in their first switch conditions and in which said first and second terminals thereof are connected and said control switches provide a high-impedance with respect to a predetermined impedance at said inputs and outputs of said output stages so as to provide a maximum output power at said first output of said second switching device, and with a minimum signal gain and in response to second control signals at said control inputs such that said first and second switch-over devices are in their second switch conditions in which said first and third terminals thereof are connected and said control switches provide a low high-frequency impedance with respect to said predetermined impedance at said inputs and outputs of said output stages so as to provide a reflection of the power output of said driver stage and feeding of the same via said first splitter/combiner stage, said first and second switch-over devices and said second splitter/combiner stage, for reflection at said output of said output stages and via said second splitter/combiner stage to said output of said power amplifier.

2. The pulse power amplifier of claim 1, wherein said control means comprises:
   first and second diodes each including an anode connected to said first control input and a cathode connected to said input of a respective output stage;
   a first capacitor connecting said anodes of said first and second diodes to a reference potential;
   third and fourth diodes each including an anode connected to said second control input and a cathode connected to said output of a respective output stage; and
   a second capacitor connecting said anodes of said third and fourth diodes to the reference potential.

3. The pulse power amplifier of claim 2, wherein: each of said diodes is a PIN diode.

* * * * *